United States Patent
Mondal et al.

(10) Patent No.: US 10,014,074 B2
(45) Date of Patent: Jul. 3, 2018

(54) FAILURE ANALYSIS AND REPAIR REGISTER SHARING FOR MEMORY BIST

(71) Applicant: GLOBALFOUNDRIES INC., Grand Cayman (KY)

(72) Inventors: Krishnendu Mondal, Bangalore (IN); Deepak I. Hanagandi, Jamkhandi (IN); Michael R. Ouellette, Westford, VT (US); Valerie H. Chickanosky, South Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 56 days.

(21) Appl. No.: 15/136,404

(22) Filed: Apr. 22, 2016

(65) Prior Publication Data
US 2017/0309349 A1    Oct. 26, 2017

(51) Int. Cl.
G11C 29/00    (2006.01)
G11C 29/44    (2006.01)
G11C 29/38    (2006.01)

(52) U.S. Cl.
CPC .............. *G11C 29/44* (2013.01); *G11C 29/38* (2013.01)

(58) Field of Classification Search
CPC ................................ G11C 29/38; G11C 29/44
See application file for complete search history.

(56) References Cited

U.S. PATENT DOCUMENTS

| | | | |
|---|---|---|---|
| 7,478,291 B2 | 1/2009 | Corbin | |
| 2011/0113280 A1* | 5/2011 | Chickanosky | G11C 29/44 714/6.12 |
| 2014/0169113 A1 | 6/2014 | Zhou et al. | |

* cited by examiner

*Primary Examiner* — Sam Rizk
(74) *Attorney, Agent, or Firm* — Anthony Canale; Andrew M. Calderon; Roberts Mlotkowski Safran Cole & Calderon, P.C.

(57) ABSTRACT

A built-in self-test (BIST) system comprising repair logic structured to share state logic of failed memories across local registers located in a shared registry which services multiple memories, wherein each of the local registers is associated with a different memory.

20 Claims, 3 Drawing Sheets

FAILURE ANALYSIS AND REPAIR REGISTER SHARING FOR MEMORY BIST

FIELD OF THE INVENTION

The present disclosure relates to a memory repair BIST system and, more particularly, to a memory repair BIST system comprising repair logic that allows multiple fails from multiple memories on the same cycle in a shared system.

BACKGROUND

Embedded memories occupy an increasingly large fraction of chip area with each progressing technology node. In fact, memories are one of the densest packed structures on the chip. However, densely packed memories are also more prone to structural issues. To increase the yield of the chip, embedded memories have redundant elements (redundant row, redundant column) which can be replaced with the faulty cell present in the normal address space. The numbers of redundancies provided to each and every memory are limited in number.

Validating that the chip was manufactured without any faults becomes an important task since the numbers of faults are increasing due to shrinking process nodes. Also, testing the embedded chip memories becomes challenging since the memory cells are packed closely together. Hence, built-in self-test (BIST) modules are permanently embedded in the design to test the memories when they are not in functional mode. Moreover, BIST becomes an essential part of the chip design in testing of these embedded memories, with each of the pre-defined patterns which are part of BIST finite state machine (FSM) detecting different kinds of faults present on the memory depending on the kind of memory that is being tested.

Memories can be repaired in couple of ways, e.g.:

Off chip repair: Most of the older technologies have an off-chip repair mechanism. In this method, a tester collects the failing information from the chip and a software algorithm analyzes the fails and gives out an optimal repair solution. Loading the repair data back into the repair registers can happen by blowing on-chip fuses with the repair data or by loading the repair information stored in flash memory by the processor into the corresponding repair register.

On-chip Repair: In these technologies, on-chip repair is provided as more faults are seen. Because of the many challenges, the on-chip solution seems to a better option as there is no need to off load the fail diagnostic information into the tester and load back the repair data back into the chip. According, this method reduces test-time, which is more valuable. Also, on-chip repair offers parallel testing of memories which will further help to reduce the Memory BIST test time. Another advantage of on-chip repair is the flexibility it provides for soft repairs of some of the faults present in the memories.

SUMMARY

In an aspect of the disclosure, a built-in self-test (BIST) system includes repair logic structured to share state logic of failed memories across local registers located in a shared registry which services multiple memories, wherein each of the local registers is associated with a different memory.

In an aspect of the disclosure, a built-in self-test (BIST) system includes: a shared registry comprising a plurality of local Failing Address and Repair Registers (FARRs) which service multiple memories; a failed arbitration block connected to a BIST, the failed arbitration block generates a fail_interrrupt signal to indicate that there is a fail in one of the multiple memories; and repair logic structured to share logic of failed memories across the local FARR registers located in the shared registry by having selected ones of the local FARR registers shifting out of the shared registry for repair by the repair logic when the fail is detected.

In an aspect of the disclosure, a method includes: placing a built-in self-test (BIST) in repair mode; executing BIST test patterns on all available memories; determining that a current memory under test of the all available memories has new failing address information; pausing the BIST test patterns; shifting a local FARR register of the failing memory into the repair logic to a register which is shared by all of the available memories; executing a repair to update the repair information to additionally repair the new failing address location; placing updated repair information into the shared register; shifting the shared register with the updated repair information back into the local FARR register for the failing memory; and resuming the BIST test patterns to continue testing.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to a memory repair BIST system and, more particularly, to a memory repair BIST system comprising repair logic that allows multiple fails from multiple memories on the same cycle in a shared system. More specifically, the repair logic of the memory repair BIST system is shared across multiple memories which are connected to the same BIST thereby reducing the area significantly with minimal increase in the test-time. In this way, the present disclosure provides a memory repair BIST system which has reduced area for failing address allocation logic. For example, with 16 memories connected to the BIST there will be an area savings in the overall FARR function of 66% and an increase in test time of much less than 1%.

In embodiments, the memory repair BIST system shares state logic (repair logic) across multiple Failing Address and Repair Registers (FARRs). In this way, the memory repair BIST system can use a global FARR register, with a single repair logic capable of accessing, loading and processing data for one of many local FARR registers, within a global register, that services all of the memories. As should be understood by those of skill in the art, the repair logic that controls the FARR registers is a majority of area within the overall FARR function, so sharing this portion amongst multiple registers saves total area without loss of repair functionality. Accordingly, by implementing the memory repair BIST system, multiple fails from multiple memories occurring on the same cycle can be managed (with serial operations to process them), which is not otherwise possible with conventional FARR logic.

Figure 1:
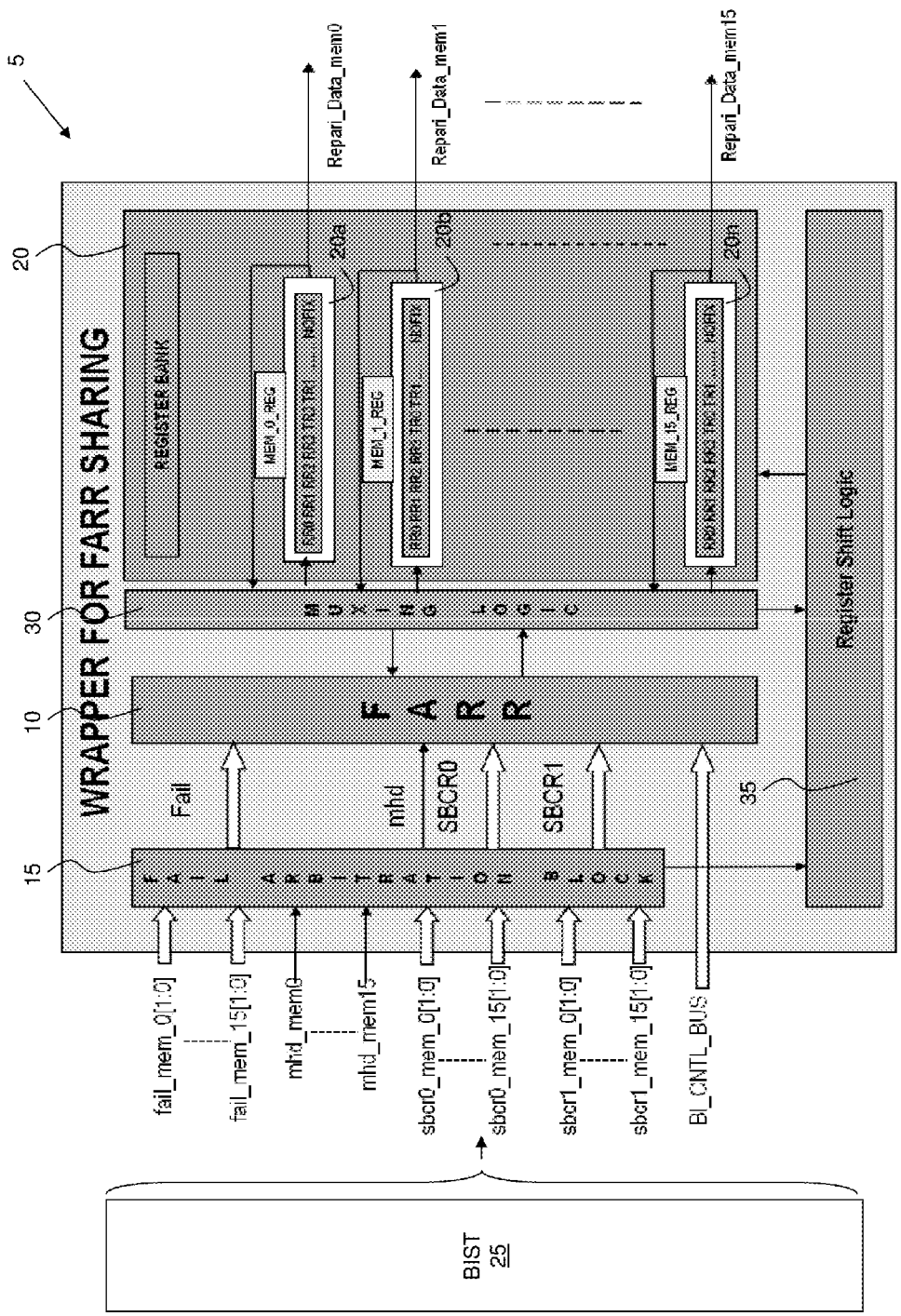
FIG. 1 shows wrapper logic for a FARR to facilitate FARR sharing in accordance with aspects of the disclosure.

FIG. 1 shows wrapper logic for a FARR to facilitate FARR sharing in accordance with aspects of the disclosure. As shown in FIG. 1, the wrapper logic 5 includes FARR logic (e.g., repair logic) 10 which is connected to a failed arbitration logic 15 and which is configured to access, load, and process fail information from a shared registry 20, e.g., shared registry. In operation, the FARR logic 10 can share the repair logic across multiple memories attached to the same memory BIST 25 without negatively affecting the test-time and thereby is able to decrease the overall test logic on the chip. That is, the FARR logic 10 can share combinational logic (e.g., state logic (repair information)) across all the memories connected to the BIST 25, using a shared registry 20. The shared registry 20 includes a plurality of registers 20a ... 20n, each of them configured and structured to store repair data for a particular memory. For example, the shared registry 20 includes 16 registers for 16 memories connected to the same BIST 25.

In more specific embodiments, the FARR logic 10 facilitates the arbitration process of collecting failing information of memories, which includes segment fail address, fail signals, and multi-hit detect (e.g., 2 or more fails in the same row) from different memories (e.g., 16 different memories) connected to the same BIST 25. The failed arbitration bank 15 facilitates sending of the fail memory information to the FARR logic 10, with the BIST 25 providing the failed arbitration bank 15 of the memories failed, and B1_CNTRL_BUS providing the address of the failed information of each data bit to the FARR logic 10.

In more specific embodiments, in operation, registers 20a ... 20n associated with repair information of corresponding memories can be shifted serially inside the FARR logic 10 if there is a fail in that corresponding memory. For example, if a fail is detected in register 20a, this register can be shifted out of the shared registry 20 and into the FARR logic 10, which can then update the register with repair information. Once the register 20a is updated, it can then be loaded back to the shared registry 20. In embodiments, register shift logic 35 provides shifting of the corresponding register that is associated with failing information of a memory, e.g., register 20a ... 20b, into the FARR logic 10 and then moving the fixed solution (e.g., repair) back to the shared registry 20.

In more specific embodiments, the failed arbitration block 15 can generate a fail_interrrupt signal to indicate that there is a fail in one of the memories. Each memory has a fail register bit inside of the FARR logic 10. Fail signals from the segments are ORed (using muxing logic 30) and registered in the fail register bit, e.g., registers 20a ... 20n of the shared registry 20. The fail register bit of 16 memories can be ORed to generate the fail_interrrupt signal which will pause BIST operations and trigger the failing address repair analysis. The failing memory is detected from the fail register bit in a round robin fashion, e.g., serially. The failing memory instance number, e.g., mem_cnt=n, is sent to the register shift logic 35 which acts as a select line for muxing logic 30 of the registers 20a ... 20n stored in the shared registry 20. Based on the select line of the muxing logic 30, the corresponding failing memory register information, e.g., located within a register 20a ... 20n, can be sent to the FARR logic 10 which can execute repairs in 2 clock cycles. The repair information is sent back to the corresponding registers 20a ... 20n in the shared registry 20, with the register shift logic 35 attending to shifting of the logic back and forth into the shared registry 20.

In embodiments, BIST 25 runs in two passes. In the first pass, BIST 25 is run on both normal address space and on redundant address space to catch the faults present in the memories. At the end of the first pass, the fault locations are repaired by enabling the corresponding repair register 20a ... 20n. In the second pass, BIST 25 is run to ensure that no faults are seen further with the redundancy enabled. The repair logic, e.g., FARR logic 10, works on the fly, with the failing column and row information being passed on to the repair logic e.g., FARR logic 10, by the BIST 25 and its sub-modules. In embodiments, incoming row and column address of a faulty location can be compared with the ones which are already fixed so as to allocate unique failing locations to the redundancies and create an optimized repair solution. For example, a second fail on the same column as a previous fail would now create a "must fix with column redundancy", and perhaps "undo" a previous repair using a spare row, and replace that repair with the use of a spare column. The memories will still have their corresponding sequential logic which includes the repair registers 20a ... 20n, FSM, valid and enable bits. For a faulty bit present on a particular memory, the repair module, e.g., FARR logic 10, moves the corresponding memories' sequential data into the repair module and executes the repair analysis operation and once again moves the repaired solution back into the corresponding sequential registers of the single, global register 20, which are specific to the corresponding memory.

Figure 2:
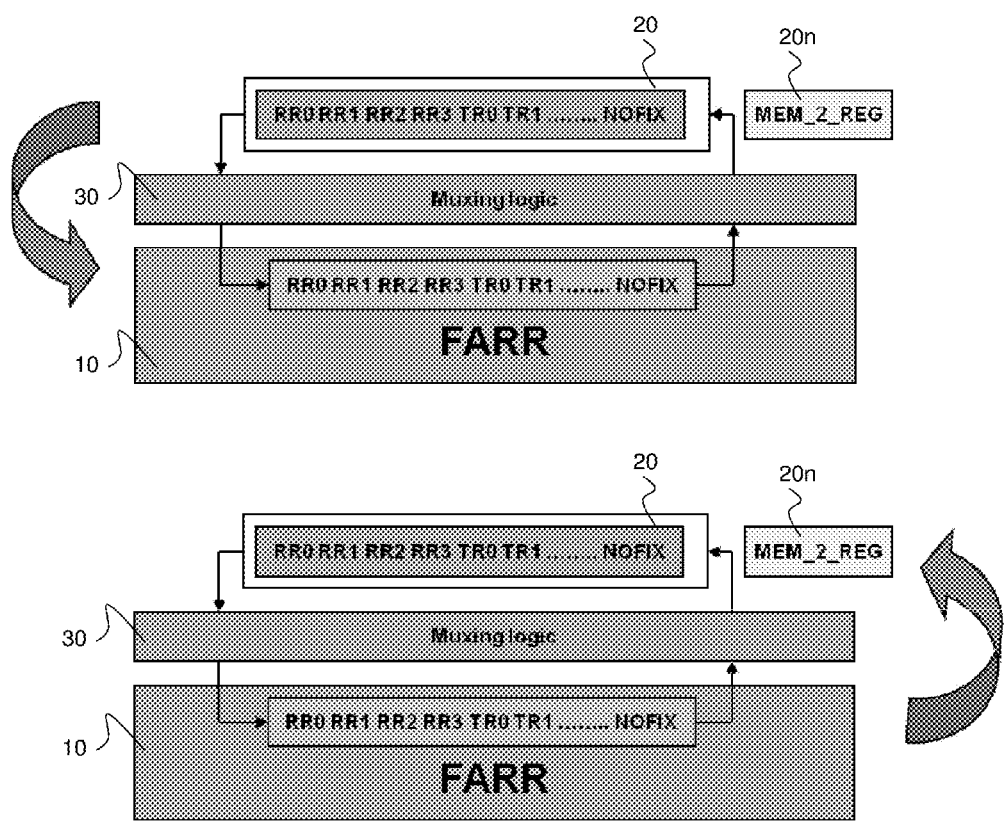
FIG. 2 shows a register shifting operation in accordance with aspects of the present disclosure.

FIG. 2 shows a register shifting operation in accordance with aspects of the present disclosure. In this schematic representation, upon detection of failed information, the local register associated with the failed memory, e.g., register 20n, is shifted out of the shared registry 20 and into the FARR logic 10 for repair (in two clock cycles). Once the repair is completed, the local register with the repair information, e.g., register 20n, is shifted back into the shared registry 20 from the FARR logic 10. This updated information will overwrite the previous repair information in the memory register, e.g., register 20n. After fixing the fail of the corresponding memory, the bit corresponding to the fail_register bit is disabled and the arbitration logic then moves on to check if there is a fail in the next fail_register bit in round-robin fashion. After checking of all the bits in the round-robin fashion then the pause signal to the BIST is reasserted and the BIST starts executing the next set of instructions.

Figure 3:
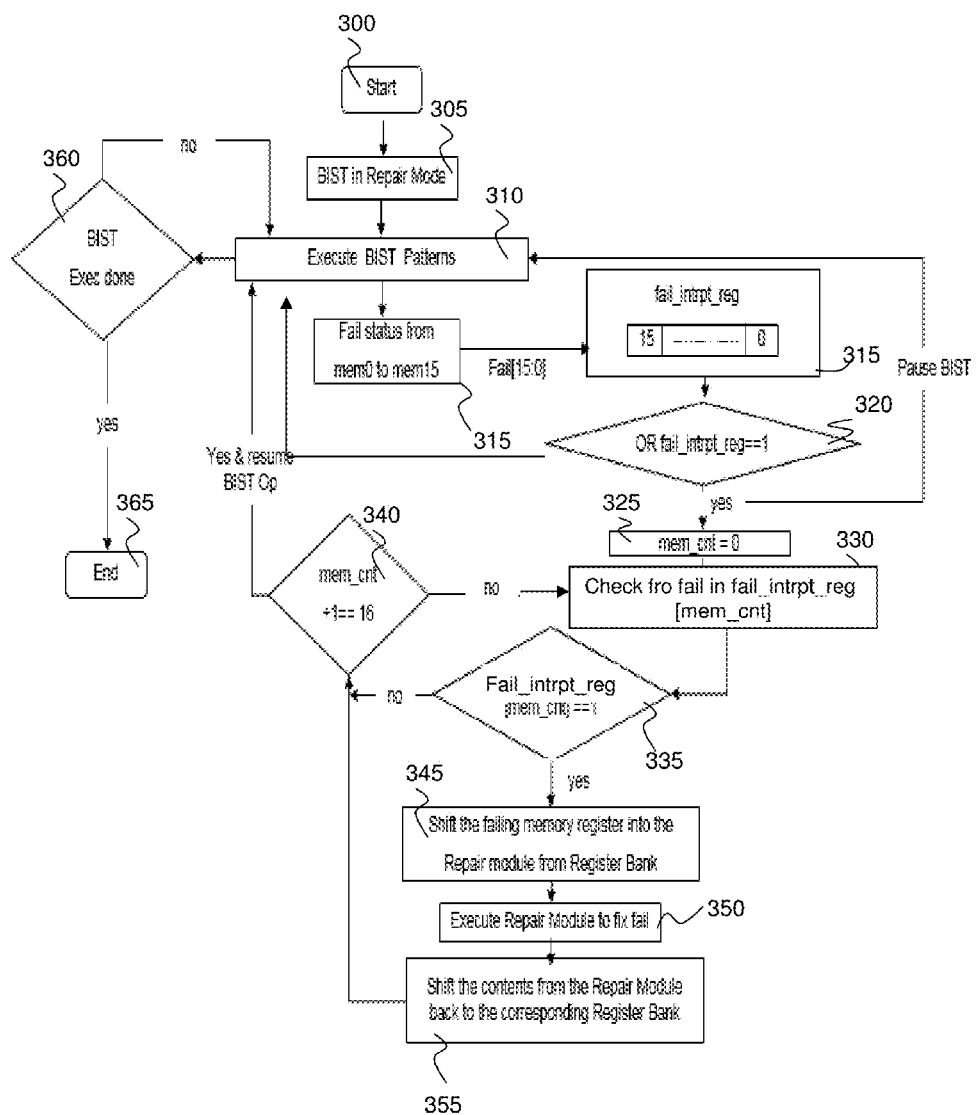
FIG. 3 shows a flow diagram of processes described in accordance with the present disclosure.

FIG. 3 shows a flow diagram of processes described in accordance with the present disclosure. The exemplary flow diagram can be illustrative of a system and a method, and related functionality implemented within the system of FIG. 1. At step 300, the processes start. At step 305, the BIST will be placed in repair mode. At step 310, the processes will begin executing BIST patterns on all available memories, e.g., 16 memories or more. At step 315, the processes will monitor the fail status (e.g., monitor OR gates to capture the fail bit data from the memory) for each memory, e.g., memory 0 to memory 15 (fail 15:0), and update the global register, e.g., fail_inrpt_reg.

At step 320, a determination is made as to whether a memory has failing information, e.g., OR fail_intrpt_reg=1. If fail information is not found, the processes return to step 315. If fail information is found at step 320, the execution of the BIST patterns will be paused and the processes will proceed to step 325. At step 325, the repair processes will start to be performed for each of the failed memories starting with, e.g., mem_cnt=0, and serially continuing to the last memory, e.g., mem_cnt=n, in a round robin fashion as shown in steps 335 to 355. In other words, at step 320, BIST patterns will continue uninterrupted, and at-speed, until at least one memory exhibits a fail.

More specifically, at step 330, the processes will check for fail information, e.g., fail_inrpt_reg, for the current memory, e.g., mem_cnt=0. At step 335, a determination will be made as to whether any fail information was found at the current memory location, e.g., [mem_cnt]==1 (in other words, does a "1" value exist at the "0" bit location of fail_intrpt_reg?). If no fail information was found, the processes will proceed to step 340, where a determination will be made as to whether any of the other memory locations, e.g., mem_cnt+1==16, have failed. In other words, do any of the other memories 1-15 contain a fail, e.g., does a "1: value exist in any of the other bit locations of fail_intrpt_reg. Once all of the memory locations have been reviewed to see if one of them failed, the processes proceed to step 310.

If all of the memory locations have not yet been reviewed, and fail information is found for one of the memories at step 335, the processes proceed to step 345. In particular, if fail information is found for a current memory under test, e.g., the first memory indicated by mem_cnt=0, the processes will shift the failing memory register into the repair logic, e.g., FARR logic, from the register bank, e.g., shared registry 20 shown in FIG. 1. At step 350, the processes will execute a repair to update the fail information to additionally repair the memory at the new failing address location within that memory. At step 355, the repair will be shifted from the repair logic back into the register bank. The processes will continue to step 340 to review the next memory to see if it failed.

At step 340, if the memory count has cycled through all of the memory locations (memories 0-15), such that mem_cnt=16, the processes will return to step 310. At this time, the processes will determine whether all of the BIST patterns at step 310 have been executed, e.g., at step 360. If they have been completed, the processes end at step 360; whereas, if all of the patterns have not yet been completed, the BIST patterns will resume at step 310.

The memory repair BIST system of the present disclosure can be manufactured in a number of ways using a number of different tools. In general, though, the methodologies and tools are used to form structures with dimensions in the micrometer and nanometer scale. The methodologies, i.e., technologies, employed to manufacture the memory repair BIST system of the present disclosure have been adopted from integrated circuit (IC) technology. For example, the structures are built on wafers and are realized in films of material patterned by photolithographic processes on the top of a wafer. In particular, the fabrication of the memory repair BIST system uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A built-in self-test (BIST) system comprising repair logic structured to share state logic of failed memories across local registers located in a shared registry which services multiple memories, wherein each of the local registers is associated with a different memory.

2. The BIST system of claim 1, wherein the repair logic is logic of Failing Address and Repair Register (FARR) and the local registers are FARR registers.

3. The BIST system of claim 2, wherein the repair logic is structured to be able to repair multiple fails occurring on the same cycle, from the multiple memories during a single BIST test pass.

4. The BIST system of claim 2, wherein the multiple memories are connected to a same BIST.

5. The BIST system of claim 4, wherein the repair logic is structured to access, load and process failing information for one of many local FARR registers, within the shared registry that services all of the memories.

6. The BIST system of claim 5, wherein the local register within the shared registry is shifted out of the shared registry into the repair logic, for repair, and shifted back into the shared registry with repair information.

7. The BIST system of claim 6, wherein each local register of the shared registry is shifted serially inside the repair logic for repair, when failed information has been detected for an associated memory, and then shifted back into the shared registry.

8. The BIST system of claim 6, wherein the repair logic is connected to a failed memory arbitration logic which generates a fail_interrrupt signal to indicate that there is a fail in at least one of the memories.

9. The BIST system of claim 6, wherein a fail_interrrupt signal will pause BIST operations.

10. The BIST system of claim 6, further comprising muxing logic which selects a local register of the shared registry which requires repair information from the repair logic.

11. The BIST system of claim 10, further comprising register shift logic which provides shifting of the local register out of the shared registry and into the repair logic.

12. A built-in self-test (BIST) system comprising:
a shared registry comprising a plurality of local Failing Address and Repair Register (FARR) registers which service multiple memories;
a failed arbitration block connected to a BIST, the failed arbitration block generates a fail_interrrupt signal to indicate that there is a fail in at least one of the multiple memories; and
repair logic structured to share logic of failed memories across the local FARR registers located in the shared registry by having selected ones of the local FARR registers shifting out of the shared registry for repair by the repair logic when the fail is detected.

13. The BIST system of claim 12, wherein the selected ones of the local FARR registers are serially shifted out of the shared registry using register shift logic connected to the shared registry.

14. The BIST system of claim 12, wherein the repair logic is structured to be able to repair multiple fails occurring on a same cycle, from the multiple memories, during a BIST test pass.

15. The BIST system of claim 14, wherein the repair logic is structured to access, load and process failing information for one of many local FARR registers, within the shared registry that services all of the memories.

16. The BIST system of claim 15, wherein fail_interrrupt signal pauses BIST operations.

17. The BIST system of claim 16, further comprising muxing logic which selects a local register of the shared registry which requires repair information from the repair logic.

18. A method, comprising:
executing BIST test patterns on all available memories;
determining that a current memory under test of the all available memories has new failing address information;
pausing the BIST test patterns;
shifting a local FARR register of the failing memory into repair logic to a register which is shared by all of the available memories;
executing a repair to update the repair information to additionally repair a new failing address location;
placing updated repair information into the shared register;
shifting the shared register with the updated repair information back into the local FARR register for the failing memory; and
resuming the BIST test patterns to continue testing.

19. The method of claim 18, further comprising cycling through all memory locations until all of the BIST test patterns on all available memories have been tested.

20. The method of claim 18, further comprising repeating the steps of claim 18 until all of the BIST test patterns on all available memories have been tested.

* * * * *